United States Patent
Macrae et al.

(10) Patent No.: US 6,870,579 B2
(45) Date of Patent: *Mar. 22, 2005

(54) SMART-CHANNEL: LEARNING-CAPABLE TELEVISION CHANNEL CHANGING APPARATUS, SYSTEM AND METHOD

(75) Inventors: Douglas B. Macrae, Weston, MA (US); Kenneth S. Hancock, Nashua, NH (US)

(73) Assignee: E Guide, Inc., Beverly Hills, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 10/180,906

(22) Filed: Jun. 25, 2002

(65) Prior Publication Data

US 2003/0128300 A1 Jul. 10, 2003

Related U.S. Application Data

(63) Continuation of application No. 09/322,767, filed on May 21, 1999, now Pat. No. 6,411,343.
(60) Provisional application No. 60/086,308, filed on May 21, 1998, and provisional application No. 60/095,737, filed on Aug. 7, 1998.

(51) Int. Cl.[7] .................................................. H04N 5/44
(52) U.S. Cl. ....................................... 348/731; 348/734
(58) Field of Search ................................. 348/734, 731, 348/553, 726, 725, 714

(56) References Cited

U.S. PATENT DOCUMENTS

| | | | |
|---|---|---|---|
| 4,060,768 A | 11/1977 | Tanaka | |
| 5,450,621 A | 9/1995 | Kianush et al. | |
| 6,188,448 B1 * | 2/2001 | Pauley et al. | 348/731 |
| 6,188,970 B1 | 2/2001 | Becker et al. | |
| 6,208,271 B1 | 3/2001 | Armstrong | |
| 6,490,001 B1 * | 12/2002 | Shintani et al. | 348/554 |

* cited by examiner

*Primary Examiner*—Victor R. Kostak
(74) *Attorney, Agent, or Firm*—Fish & Neave

(57) ABSTRACT

System and method for learning the optimal channel change instruction recognition speed for an entertainment system. A memory stores information relating to: time increments between channel change signals; pulse width of each individual digit of a channel instruction; and the duration of time between each digit pulse signal. Based on the information stored in memory, a microprocessor constructs and sends channel change commands at a particular speed, progressively increasing the speed. When the speed at which channel change commands are sent exceeds the capability of the television receiver to recognize the channel change command, the microprocessor reduces the speed, as a function of the information stored in memory, until the television receiver can recognize the channel change command. The microprocessor stores in memory the fastest speed at which the television receiver can recognize the channel change command. Thereafter, the microprocessor uses the optimal speed to deliver channel change commands.

56 Claims, 8 Drawing Sheets

SMART-CHANNEL: LEARNING-CAPABLE TELEVISION CHANNEL CHANGING APPARATUS, SYSTEM AND METHOD

This application is a continuation of U.S. Pat. No. 6,411,343, which in turn claim the benefit of U.S. Provisional Patent Application Nos. 60/086,308 ("SMART-CHANNEL: LEARNING-CAPABLE TELEVISION CHANNEL CHANGING APPARATUS AND METHOD"), and 60/095,737 ("SMART-CHANNEL: LEARNING-CAPABLE TELEVISION CHANNEL CHANGING APPARATUS AND METHOD") the disclosures of which are incorporated herein by reference, as if fully stated herein, for all purposes.

FIELD OF THE INVENTION

The present invention relates generally to television systems and VCR systems, and more particularly, to any learning-capable television channel changing device which controls a remote device via infrared or radio frequency, such as a television, VCR, cable box or satellite receiver.

BACKGROUND OF THE INVENTION

Television viewers frequently search available real-time television programs by using a remote control device to change channels. The viewer could use the numeric keys on the viewer's remote control device to enter the precise number of a particular channel. After the viewer enters the digits for a particular channel, the viewer must wait until the channel change device recognizes the viewer's entry of the digits as an instruction to change channels to the particular channel. Often, the time that the viewer must wait after the time that the viewer has entered the last digit of the channel until the time that the television displays the content of the identified channel is much longer than the viewer expects.

Alternatively, the viewer can sequentially, incrementally change channels, typically by using the up and down channel keys on the viewer's remote control device. Television viewers who incrementally change channels typically disapprove of, and become impatient with, a long lag time between the viewer's pressing an up or down channel key on the viewer's remote control device and the actual changing of the channel.

Incremental channel change speed may be set by a particular manufacturer to occur more slowly than desired by a particular viewer. Furthermore, incremental channel change speed can depend upon the level of integration of the viewer's entertainment system components. Mixing components of different manufacturers, or even different technology advancements by a single manufacturer, in a single entertainment system can result in degradation of incremental channel change speed.

There is a need, therefore, for a method and apparatus that is capable of learning, for the components of a particular entertainment system, the optimal speed and timing with which the viewer's instruction to the channel change device to change channels will be recognized by the components of a particular entertainment system. Similarly, there is a further need for a method and apparatus that is capable of constructing and delivering a change channel instruction to the components of a particular entertainment system according to the optimal speed and timing with which the viewer's instruction to the channel change device to change channels will be recognized by the components of that particular entertainment system.

SUMMARY OF THE INVENTION

The present invention is directed to an apparatus and method that satisfies these needs. There is, therefore, provided, according to a preferred embodiment, methods, systems and apparatus for learning the optimal channel change instruction recognition speed for the components of a particular entertainment system. A memory provides storage for information relating to: time increments between channel change signals; pulse width of each individual digit of a channel instruction; and the duration of time between each digit pulse signal. As a function of the information stored in memory, a microprocessor generates and sends channel change commands at a particular speed, progressively increasing the speed. A means is provided for monitoring the television receiver and for detecting whether the channel change command resulted in the change of the programming channel received by the television receiver. When the speed at which channel change commands are generated and sent exceeds the capability of the television receiver to recognize the channel change command, the microprocessor reduces the speed, as a function of the information stored in memory, until the television receiver can recognize the channel change command. The microprocessor stores in memory the fastest speed at which the television receiver can recognize the channel change command. Thereafter, the microprocessor uses the optimal speed to construct and deliver channel change commands.

DESCRIPTION OF THE DRAWINGS

These and other features, aspects, and advantages of the present invention will become better understood with regard to the following description, appended claims, and accompanying drawings where:

DETAILED DESCRIPTION OF THE INVENTION

A channel change command consists of a series of pulses, one for each individual digit of a channel. In order to recognize a channel change command, the entertainment system channel changing device must be able to recognize each individual pulse, and must be able to recognize the series of pulses as a discrete command. When multiple channel change commands are sent back-to-back, the channel change device must be able to determine the end of the first command and the beginning of the second command.

Accordingly, in order to optimize the speed at which channels can be changed, the apparatus and method of the present invention optimizes the following three main components of channel change instruction speed: 1) the period of time between one channel change command being sent to the channel change device and the time at which the next channel change command is sent to the channel change device ("inter-channel instruction time"); 2) the pulse width of each individual digit of a channel change instruction ("channel digit pulse width"); and 3) the period of time between the end of the pulse signal for one digit of a channel change command, and the beginning of the pulse signal for the next digit of a channel change command ("inter-digit time").

With regard to inter-channel instruction time, the shorter the period of time between the time at which two subsequent channel change commands are sent to the channel change device, the faster the speed at which the channel change commands are sent. With regard to channel digit pulse width, the shorter the duration of each pulse, the shorter the duration of the entire channel change command. With regard to inter-digit time, the shorter the period of time between digit pulses, the shorter the duration of the entire channel change command.

Figure 2:
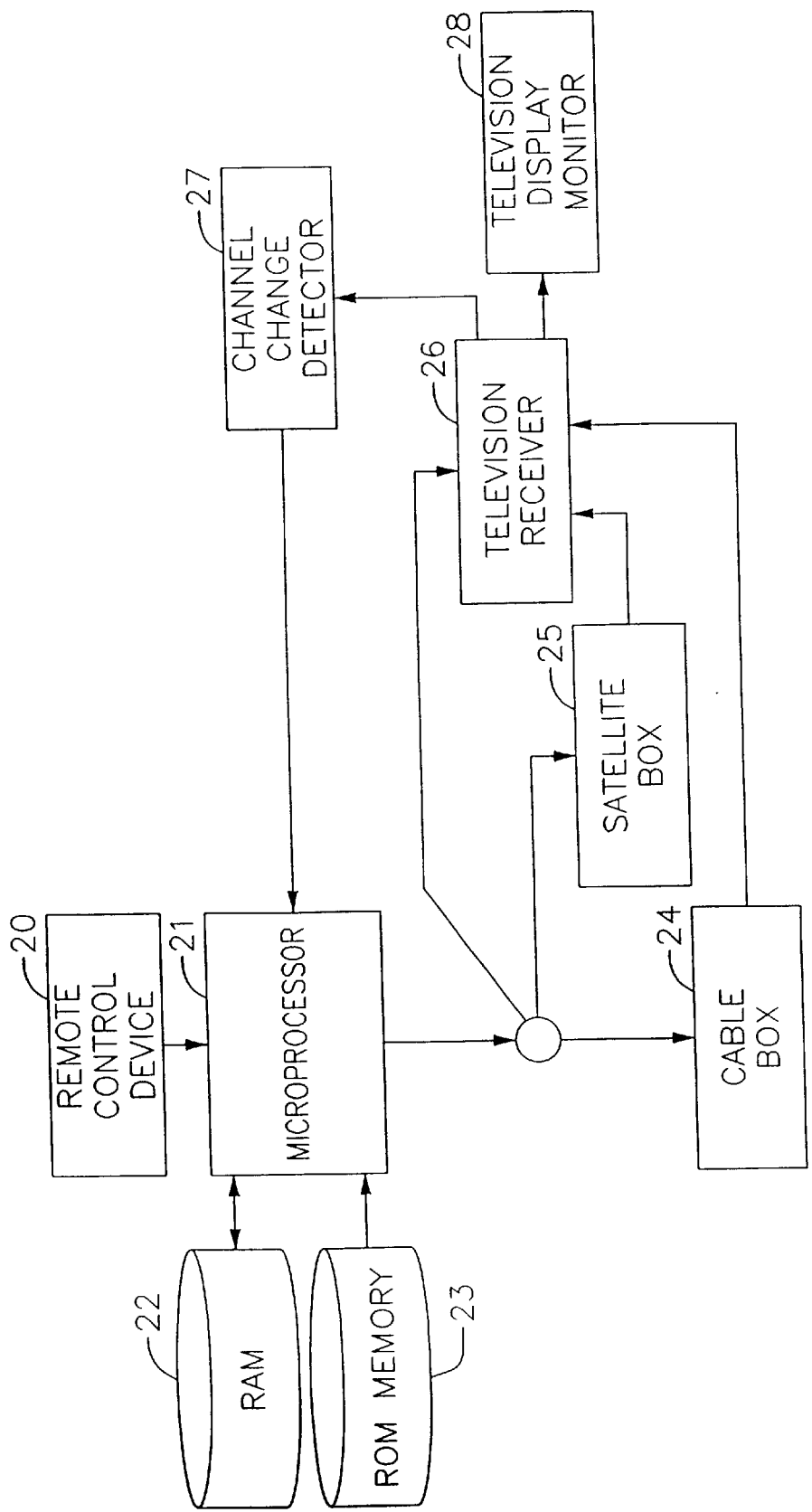
FIG. 2 is an electrical block diagram of the learning-capable channel changing apparatus used in accordance with one embodiment of the present invention.

A. Learning and Optimizing Discrete Channel Change Instruction Recognition Speed One embodiment of the present invention provides the television viewer the opportunity to instruct the viewer's entertainment system to optimize the speed at which a discrete channel change instruction can be recognized. To do this, the present invention optimizes, for the particular entertainment system components: 1) the channel digit pulse width; and 2) the inter-digit time. The viewer performs a setup process one time to initialize the system's optimization of the channel digit pulse width and the inter-digit time. The viewer uses a viewer input device 20 as seen in FIG. 2, preferably the viewer's handheld infrared (IR) remote control device, to select the channel changing speed optimization process from a menu of initialization procedures. The viewer input device 20 is coupled to the microprocessor 21 to provide viewer control of the television channels.

The Microprocessor 21 can be a television microprocessor used to perform other functions and that is further programmed to carry out the invention or the Microprocessor 21 can be a dedicated microprocessor programmed to carry out the invention that works with the television microprocessor. As shown in FIG. 2, the Microprocessor 21 is coupled with one or more channel changing devices in the viewer's entertainment system. It should be understood that the use herein of the phrases "coupled with" and "coupled to" include among other things physical connections, electrical connections, and means of communications between two devices, such as, for instance using wireless communications such as infra-red transmitters and receivers to communicate data, signals and/or instructions. The Microprocessor 21 may be coupled with a cable box 24, a satellite box 25, and/or a television receiver 26. In entertainment systems where the Microprocessor 21 is coupled to more than one channel changing device, the Microprocessor 21 learns the optimal channel changing speed for each such device.

Figure 3A:
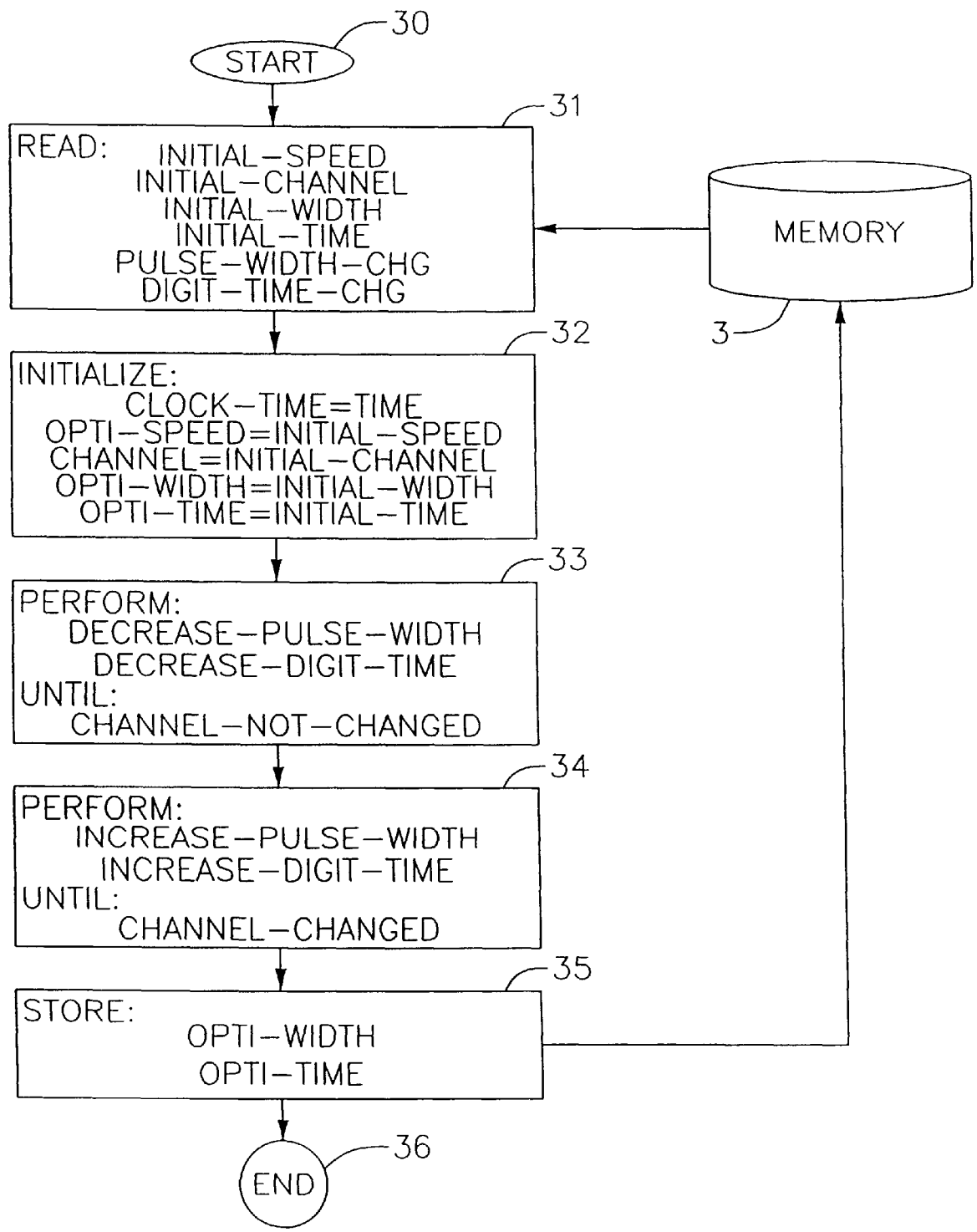
FIGS. 3a, 3b, 3c, 3d, 3e, 3f, and 3g are flow diagrams of the learning-capable channel changing apparatus used in accordance with one embodiment of the present invention.

In the learning initialization procedure, the viewer is asked to make selections from a menu of options to identify the components in the viewer's entertainment system. The viewer is also asked to select from a menu of options an initial channel digit pulse width and an initial inter-digit time. The viewer is also asked to select from a menu of options the decrements with which the channel digit pulse width and the inter-digit time would be decreased. The viewer uses the viewer's input device to make the appropriate selections. Information concerning the viewer's selections is saved in memory 3 as shown in FIG. 3a. Alternatively, the initial channel digit pulse width, the initial inter-digit time, and the decrements with which the channel digit pulse width and the inter-digit time would be decreased are set by the manufacturer of the television or remote.

Flow charts of one embodiment of the operation of the initial learning setup procedure are shown in FIGS. 3a, 3b, 3c, 3d, 3e, 3f, and 3g. As depicted in FIG. 3a, the channel changing optimization learning system begins 30, after device and speed information has been initialized in memory 3. The system reads 31 previously initialized channel change information such as an initial speed (INITIAL-SPEED), an initial channel (INITIAL-CHANNEL), an initial pulse width (INITIAL-WIDTH), an initial time (INITIAL-TIME), a pulse width increment (PULSE-WIDTH-CHG), and a digit time increment (DIGIT-TIME-CHG), from memory 3. In one embodiment, the channel change information has been previously initialized by the viewer during a one-time set-up procedure as described above.

As shown in the Initialization Procedure 32, the system initializes values for the time, optimal speed, the channel, the optimal pulse width and the optimal digit time. As shown in Block 32, the system records (in CLOCK-TIME) the actual time (TIME). Also as shown in Block 32, the system initializes the optimum speed (OPTI-SPEED) at which to send channel change commands with a previously set initial speed (INITIAL-SPEED). As is also shown in Block 32, the system initializes the optimum channel digit pulse width (OPTI-WIDTH) and the optimum inter-digit time (OPTI-TIME) with previously set initialization values, (INITIAL-WIDTH and INITIAL-TIME, respectively). As is also shown in Block 32, the system initializes the channel digit pulse width decrement (PULSE-WIDTH-CHG) and the inter-digit time decrement (DIGIT-TIME-CHG) with previously set initialization values read from memory.

Figure 3B:
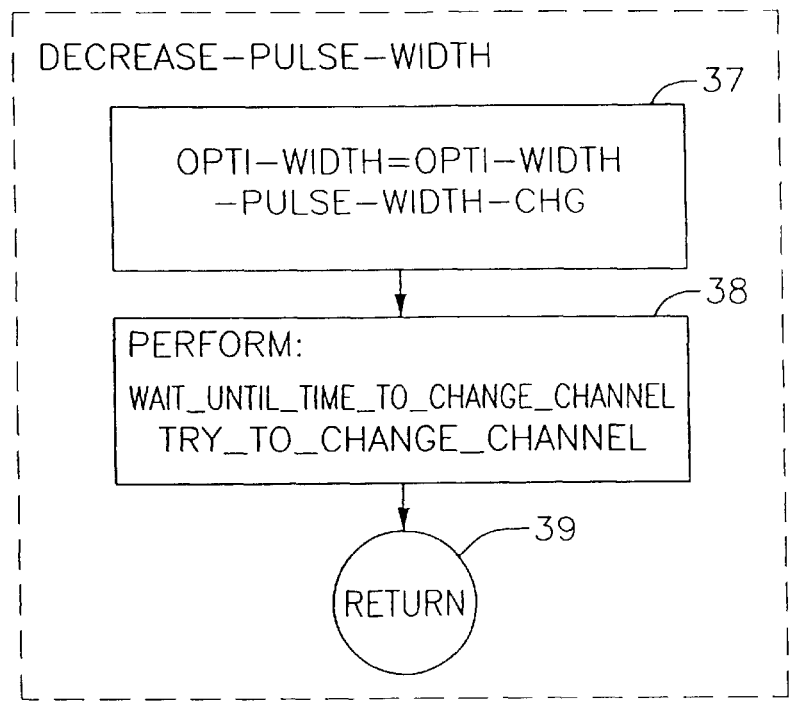
Figure 3C:
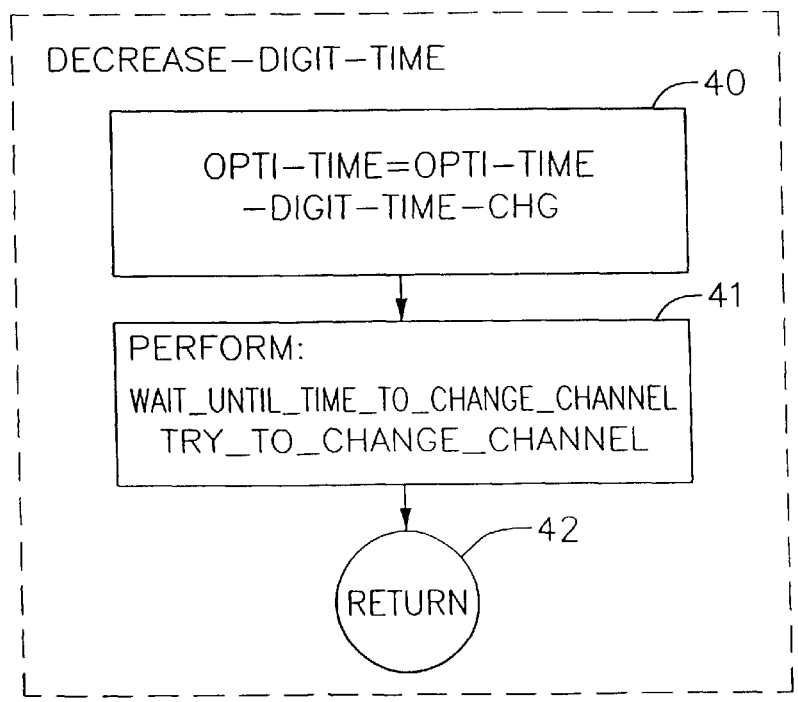

Based upon the initialized information, as shown in Procedure Block 33, the pulse width and the inter-digit time are decreased and a channel change command for the particular channel-changing device type in the viewer's entertainment system is sent (FIGS. 3b, 3c, 3d and 3e). This process is continued until the channel changing device can no longer recognize the channel change command. One embodiment of the process for optimizing pulse width is depicted in FIG. 3b and is described further below. One embodiment of the process for optimizing digit time is depicted in FIG. 3c and is described further below.

Figure 3D:
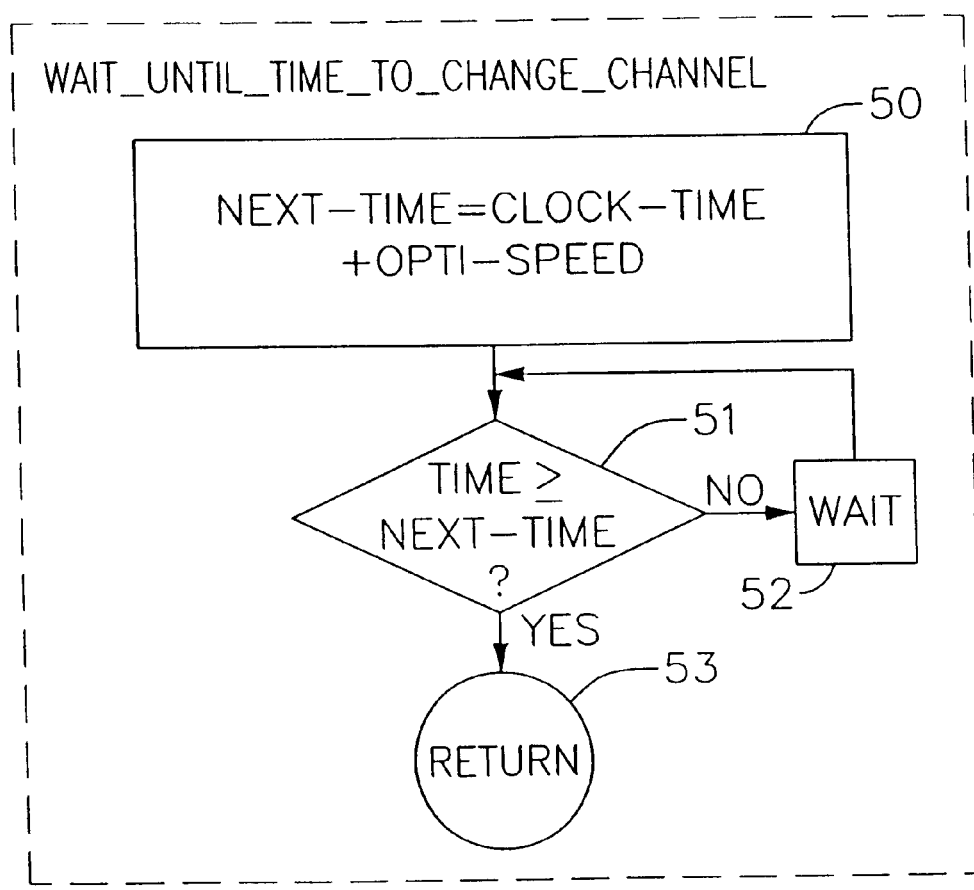
Figure 3E:
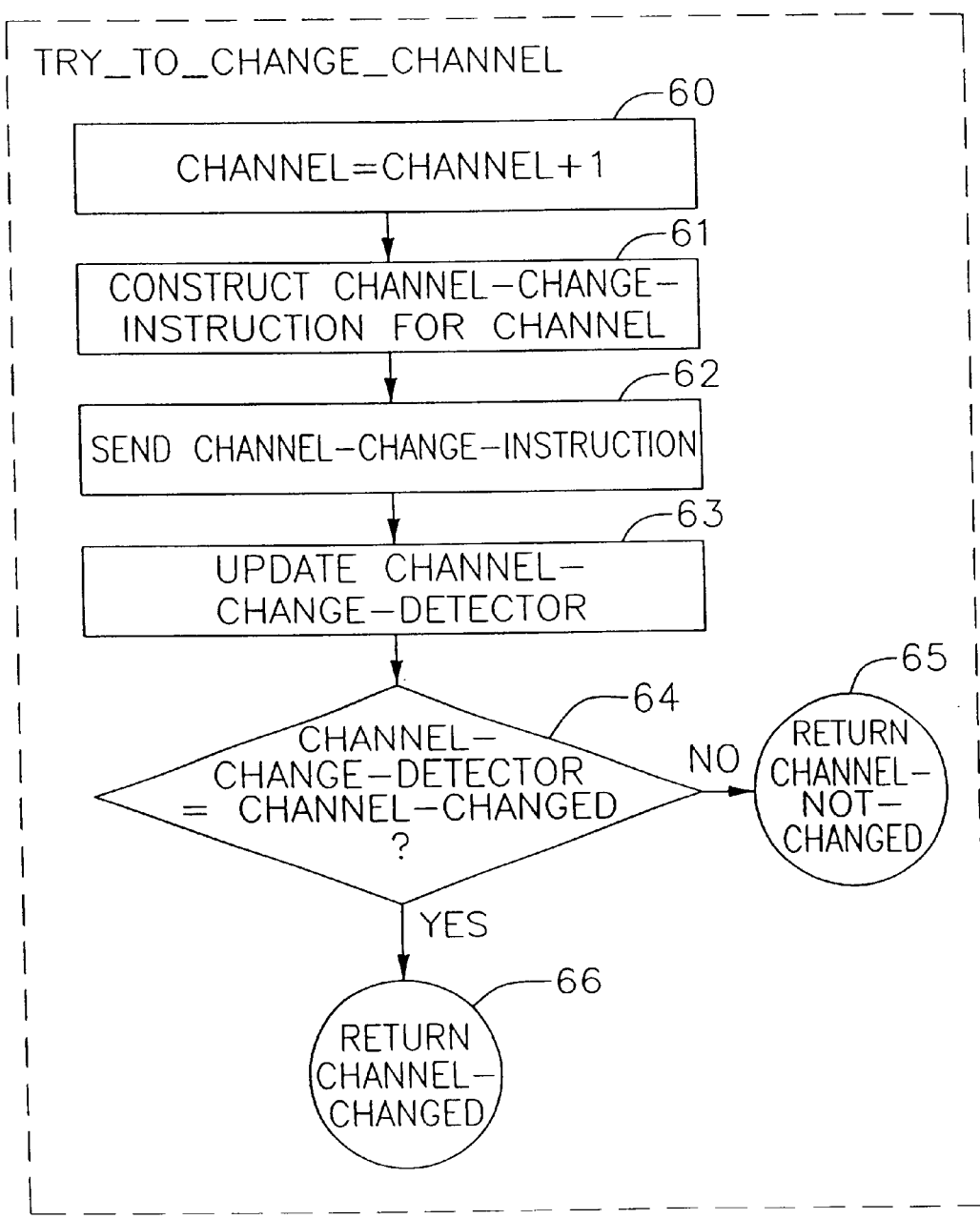

As depicted in FIG. 3b, to optimize the pulse width the pulse width (OPTI-WIDTH) is first decreased by the pulse width decrement (PULSE-WIDTH-CHG) 37. The Microprocessor 21 is programmed to wait until a particular time at which a change channel instruction should be sent and then tries to change a channel 38. The Microprocessor 21 is programmed to return to the process that performed the pulse width optimization routine 39. One embodiment of the process to wait until a particular time at which a change channel instruction should be sent is depicted in FIG. 3d and is described below. One embodiment of the process to try to change a channel is depicted in FIG. 3e and is described below.

As depicted in FIG. 3c, to optimize the digit time the digit time (OPTI-TIME) is first decreased by the digit time decrement (DIGIT-TIME-CHG) 40. The Microprocessor 21 is programmed to wait until a particular time at which a change channel instruction should be sent and then tries to change a channel 41. The Microprocessor 21 is programmed to return to the process that performed the digit time optimization routine 42. One embodiment of the process to wait until a particular time at which a change channel instruction should be sent is depicted in FIG. 3d and is described below. One embodiment of the process to try to change a channel is depicted in FIG. 3e and is described below.

As depicted in FIG. 3d, the Microprocessor 21 sets the time (NEXT-TIME) at which a channel change command should be sent to the current clock time (CLOCK-TIME)

plus the optimum speed increment (OPTI-SPEED). The Microprocessor 21 is programmed to repeatedly check whether the current clock time (TIME) exceeds or is equal to the time calculated as the next time (NEXT-TIME) a channel change instruction should be sent 51. The Microprocessor 21 is programmed to continue repeatedly performing the TIME/NEXT-TIME comparison until the current clock time (TIME) exceeds or is equal to the time calculated as the next time (NEXT-TIME) (51, 52). When the current clock time (TIME) exceeds or is equal to the time calculated as the next time (NEXT-TIME), the Microprocessor 21 returns 53 to the procedure that performed the procedure to wait until a particular time at which a change channel instruction should be sent.

As depicted in FIG. 3e, the system's microprocessor 21 increases the channel 60, constructs a channel change command 61, and sends the command 62 to the channel changing device, for example, a cable box 24, a satellite box 25, or a television receiver 26.

In one embodiment, each channel change command is preceded by an initializing channel change command. In an initializing channel embodiment, the Microprocessor 21 is programmed to send a channel change command that resets the television receiver to a particular channel, for instance, the "INITIAL-CHANNEL." For instance, in an initializing channel embodiment, the Microprocessor 21 is programmed to precede function block 37 in FIG. 3b, function block 40 in FIG. 3c, function block 70 in FIG. 3f, and function block 80 in FIG. 3g with the steps, as depicted in FIG. 4, which would include: setting CHANNEL equal to INITIAL-CHANNEL (100); constructing a CHANNEL-CHANGE-INSTRUCTION for INITIAL-CHANNEL (101); setting NEXT-TIME equal to CLOCK-TIME plus INITIAL-SPEED (102); waiting until TIME greater than or equal to NEXT-TIME (103, 104, 106); when TIME is greater than or equal to NEXT-TIME (105), sending the CHANNEL-CHANGE-INSTRUCTION to the television receiver (107).

As shown in FIG. 2, the television receiver 26 is monitored by the Channel Change Detector 27. As shown in FIG. 3e, the Channel Change Detector is interrogated (63, 64) to determine whether or not the last sent channel change command resulted in the channel received by the television receiver being changed.

The change of channels can be detected in various ways. In one embodiment, the channel identification of each channel delivering television programming is embedded in the Vertical Blanking Interval ("VBI") in XDS format. The output of the television drive circuitry is connected to the input of a VBI decoder. The VBI decoder strips the XDS signal from the baseband television signal. The output of the VBI decoder includes a data signal representative of the channel identification of the channel to which the television is tuned.

The Channel Change Detector 27 detects whether the data signal representing the current channel to which the television is tuned to the channel is the same or is different from the data signal to which the television was tuned prior to the most recent channel change instruction being sent. The Channel Change Detector 27 updates what is referred to herein as the CHANNEL-CHANGE-DETECTOR. If the data signal representing the current channel to which the television is tuned is different than the data signal representing the channel to which the television was tuned prior to the most recent channel change instruction being sent, the Channel Change Detector 27 updates the CHANNEL-CHANGE-DETECTOR (63) to indicate that the channel has been changed. If, on the other hand, the data signal representing the current channel to which the television is tuned is the same as the data signal representing the channel to which the television was tuned prior to the most recent channel change instruction being sent, the Channel Change Detector 27 updates the CHANNEL-CHANGE-DETECTOR (63) to indicate that the channel has not been changed. The Microprocessor 21 checks the CHANNEL-CHANGE-DETECTOR to see if the channel has been changed (64). If the current channel is different from the previous channel (the "Y" path from decision Block 64, FIG. 3e), then the channel change command caused the channel to change (channel change successful). Otherwise, the current channel is the same channel to which the television was tuned prior to the last channel change command, (the "N" path from decision Block 64) and no change of channels has occurred (channel change not successful).

In another embodiment, a means of isolating the vertical sync signal is provided. For more detail on sync separators, see, e.g., *Television Engineering Handbook, Revised Edition*, McGraw-Hill, Inc., K. Blair Benson, Editor and coauthor, revised by Jerry C. Whitaker, 13.5–13.17 (1992). A change in channels is detected by interrogating the vertical sync signal. If the vertical sync signal has been interrupted, then a change of channels has occurred (the "Y" path from decision Block 64). If there has not been an interruption in the vertical sync signal, then there has been no change of channels (the "N" path from decision Block 64).

If the channel change instruction was successful (the "Y" path from decision Block 64), then the Microprocessor 21 is programmed to indicate that the channel has been changed and returns to the procedure that performed the process of trying to change channels 66. Otherwise (the "N" path from decision Block 64), the Microprocessor 21 is programmed to indicate that the channel has not been successfully changed before returning to the procedure that performed the process of trying to change channels 65.

As depicted in FIG. 3a, the pulse/time decrement loop, Block 33, is repeated until the channel change device can not recognize the last channel change command (the "N" path from decision Block 64). When the last channel change instruction was not successful (the "N" path from decision Block 64), then one or more of the pulse width or the inter-digit timing were insufficiently small to be recognized by the channel change device.

Figure 3F:
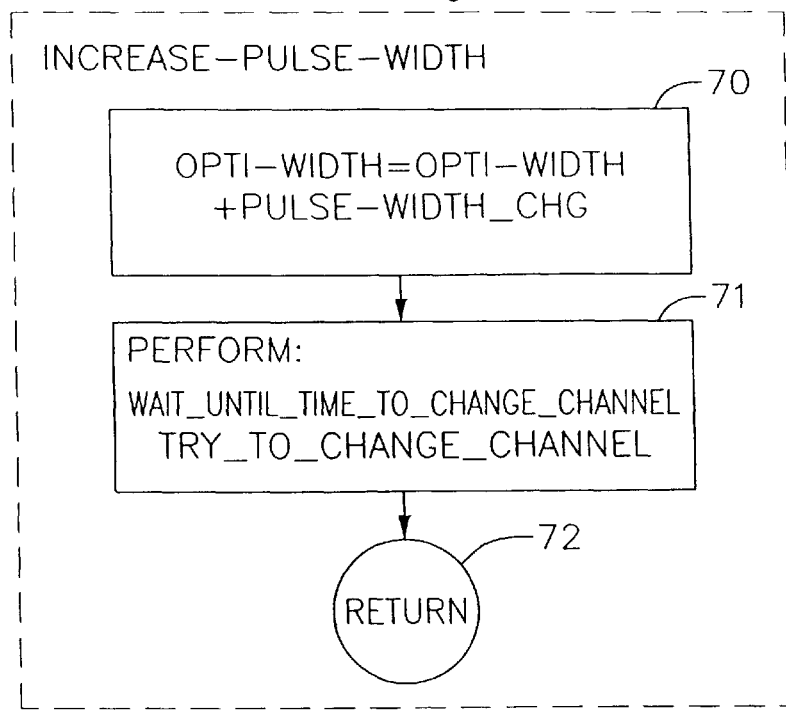
Figure 3G:
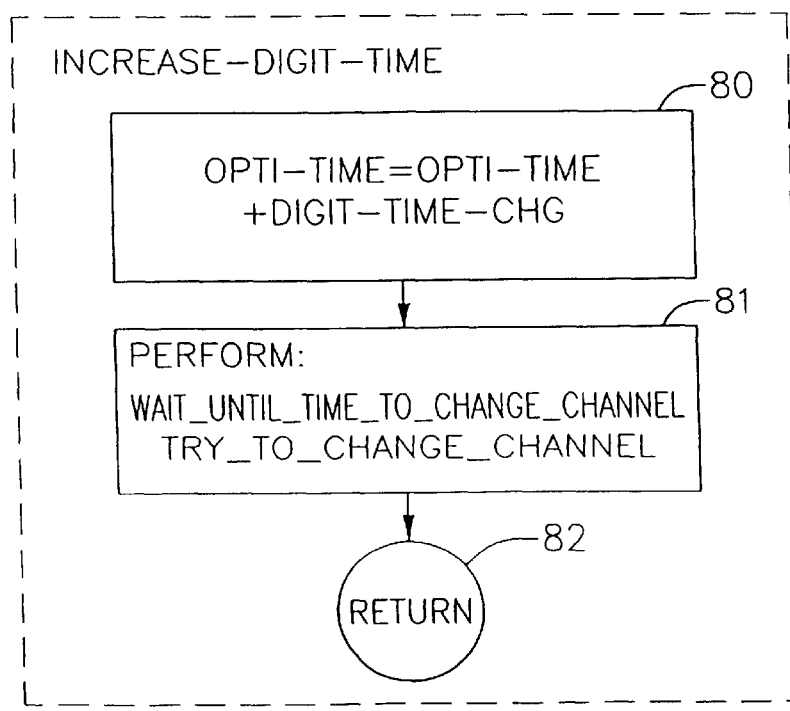
Figure 4:
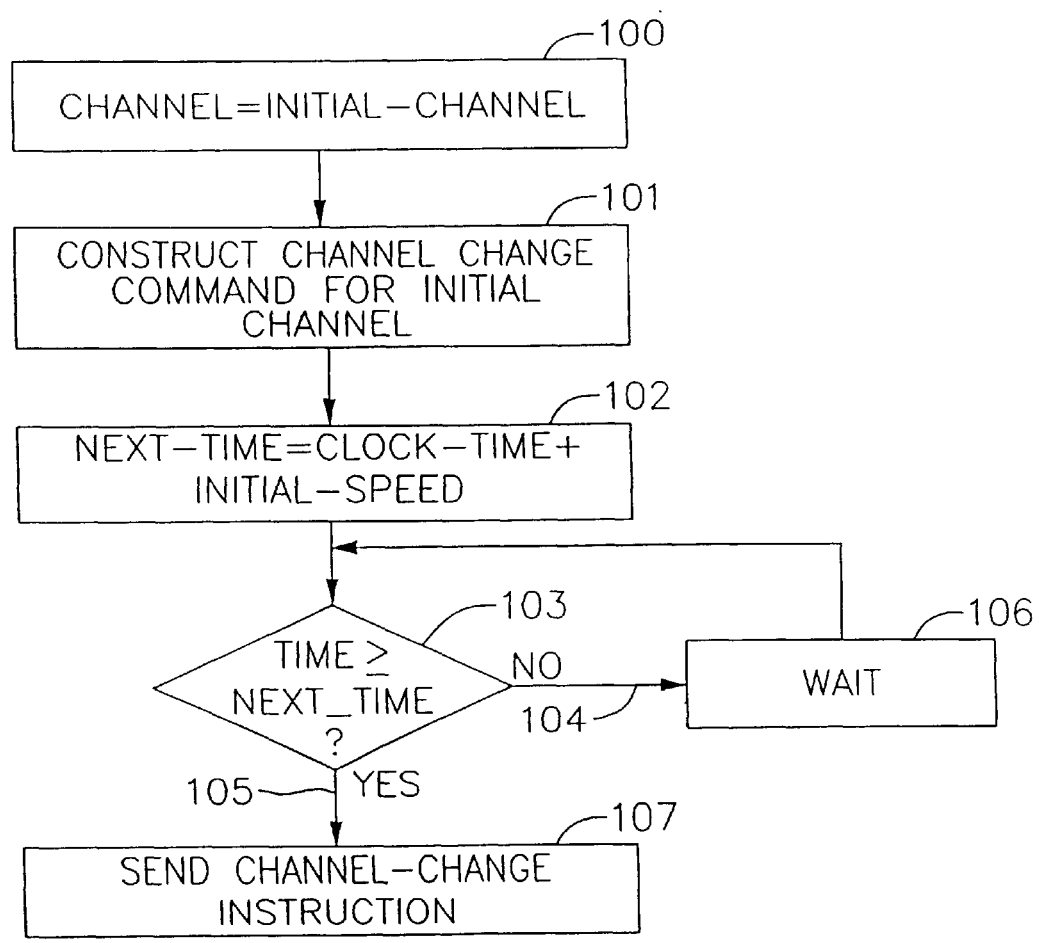
FIG. 4 is a flow diagram of the learning-capable channel changing apparatus used in accordance with an alternative embodiment of the present invention.

As depicted in FIG. 3a, the Microprocessor 21 is programmed to perform the process of increasing the pulse width (as depicted in FIG. 3f) and the digit time (as depicted in FIG. 3g) until the channel change can be recognized.

As depicted in FIG. 3f, the system increases the pulse width by the amount of PULSE-WIDTH-CHG 70, waits until the appropriate time to send a next channel change instruction (as depicted in FIG. 3d), tries to change channels (as depicted in FIG. 3e) 71, before returning to the process that performed the pulse width increase routing 72.

If the channel change instruction is still not successful, then as depicted in FIG. 3g, the system accordingly increases the inter-digit time by the amount of DIGIT-TIME-CHG 80 waits until the appropriate time to send a next channel change instruction (as depicted in FIG. 3d), tries to change channels (as depicted in FIG. 3e) 81, before returning to the process that performed the pulse width increase routing 82.

As depicted in FIG. 3a, the system stores 35 the final optimum channel digit pulse width (OPTI-WIDTH) and the final optimum inter-digit time (OPTI-TIME) at which a channel change command was recognized by the system in Memory 3 for every future use of the channel changing device. At that point, the initial learning setup procedure is complete 36.

It should be understood that the data names used herein, identified with all capital letters and which are frequently hyphenated words, are used for descriptive purposes and are not in any way a limitation of the invention.

In one embodiment, there are multiple channel change devices coupled to the television receiver, and the initial learning setup procedure is repeated to learn the optimum channel change component speeds for each device. In one such multiple channel change device embodiment, there is a single microprocessor in the television receiver programmed to carry out the invention; in another such multiple channel change device embodiment, there is a microprocessor programmed to carry out the invention in each device for which channels are to be changed.

B. Learning and Optimizing Incremental Channel Change Instruction Recognition Speed One embodiment of the present invention provides the television viewer the opportunity to instruct the viewer's entertainment system to learn the optimal speed for incremental channel changing for that viewer's entertainment system. The viewer performs a setup process one time to initialize the system's optimization of incremental channel changing speed. The viewer uses a viewer input device 20 as seen in FIG. 2, preferably the viewer's hand-held infrared (IR) remote control device, to select the incremental channel changing speed optimization process from a menu of initialization procedures. The viewer input device 20 is coupled to the Microprocessor 21 to provide viewer control of the television channels. In the learning initialization procedure, the viewer is asked to make selections from a menu of options to identify the components in the viewer's entertainment system. The viewer is also asked to select from a menu of options, the increment with which the speed of channel changing would be increased during the optimization learning process. The viewer uses the viewer's input device to make the appropriate selections. Information concerning the viewer's selections is saved in memory 3 as shown in FIG. 1.

Figure 1:
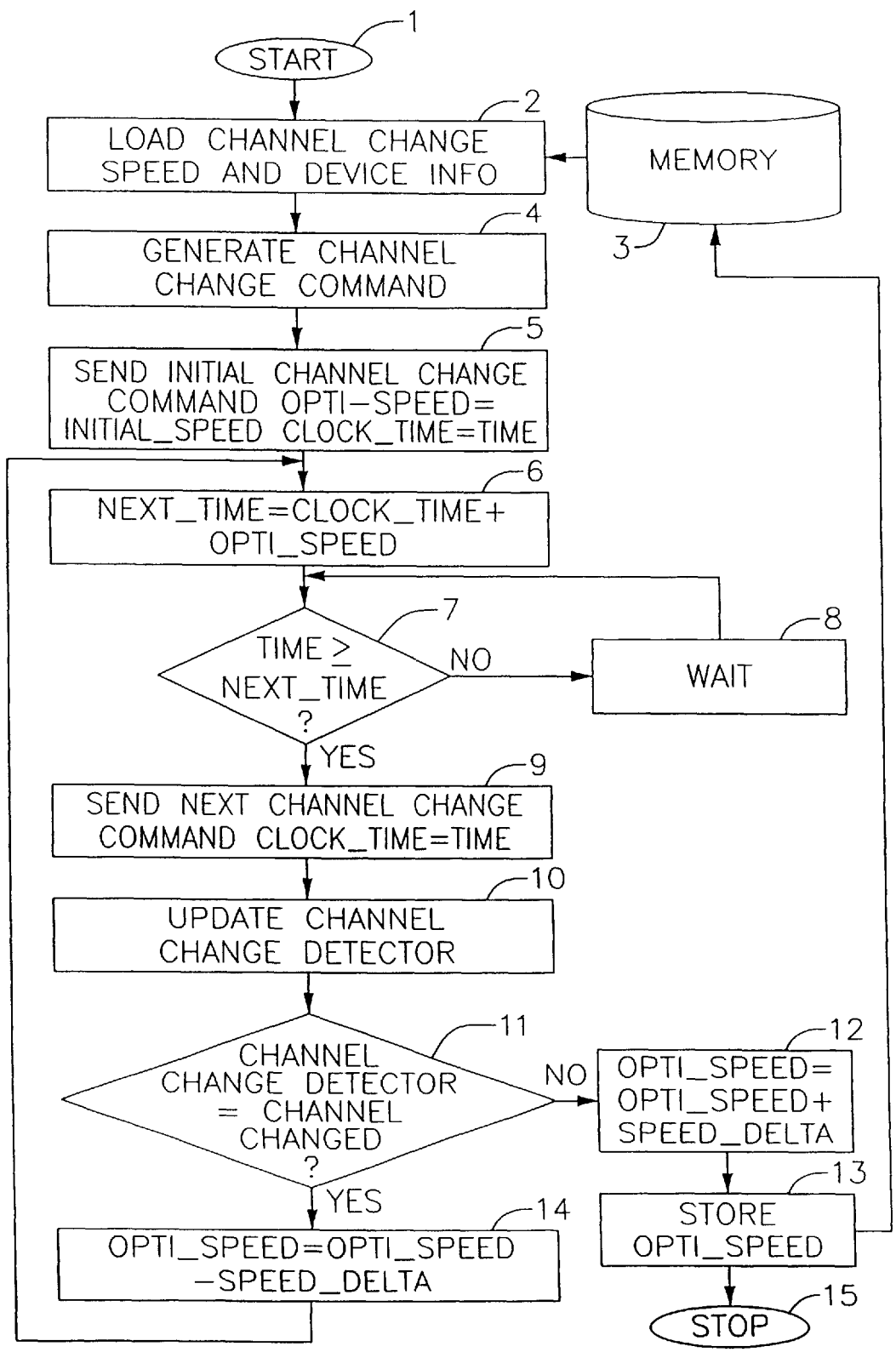
FIG. 1 is a flow diagram of the learning-capable channel changing apparatus used in accordance with one embodiment of the present invention.

In FIG. 1, a flow chart of one embodiment of the operation of the initial learning setup procedure is shown. The channel changing optimization learning system begins, at Start Terminal 1, after device and speed information has been initialized. At the Load Procedure 2, the system loads previously initialized channel change information from memory 3. In one embodiment, the channel change information has been previously initialized by the viewer during a one-time set-up procedure as described above.

Based upon the previously initialized information, the system then generates, as shown in Generation Procedure Block 4, a channel change command for the particular channel-changing device type in the viewer's entertainment system. As shown in FIG. 2, the Microprocessor 21 is coupled with one or more channel changing devices in the viewer's entertainment system. The Microprocessor 21 may be coupled with a cable box 24, a satellite box 25, and/or a television receiver 26. In entertainment systems where the Microprocessor 21 is coupled to more than one channel changing device, the Microprocessor 21 learns the optimal channel changing speed for each such device.

As shown in FIG. 1, after the system's Microprocessor 21 generates a channel change command 4, the system sends the command 5 to the channel changing device, for example, a cable box 24, a satellite box 25, or a television receiver 26. As shown in Block 5, the system records (in CLOCK-TIME) the actual time (TIME). Also as shown in Block 5, the system initializes the optimum speed (OPTI-SPEED) at which to send channel change commands with a previously set initial speed (INITIAL-SPEED). The system's Microprocessor 21 then sets, in Block 6, the time, NEXT-TIME, at which the system should send the next channel change command. As seen in Block 6, NEXT-TIME is set to a time that equals the clock-time at which the previous channel change command was sent plus the previously set speed increment (OPTI-SPEED). As seen in the decision Block 7, the system then compares the real-time clock-time with the time scheduled for the next channel change command to be sent. As seen in the decision loop comprised of decision Block 7 and the Wait Block 8, the system waits until the real-time clock-time equals or exceeds the time scheduled for the next channel change command to be sent. At the appointed time, the system sends the next channel change command, as shown in Block 9.

As shown in FIG. 2, the television receiver 26 is monitored by the Channel Change Detector 27. As shown in FIG. 1, the Channel Change Detector is interrogated to determine whether or not the last sent channel change command resulted in the channel received by the television receiver being changed. As described above, the change of channels can be detected in various ways.

If the channel change instruction was successful (the "Y" path from decision Block 11), then the Microprocessor 21 increases the speed 14 at which the next channel change command is sent. The speed increment loop, blocks 6 through 14 inclusive, is repeated until the channel change commands are sent at a speed that exceeds the channel change device's capability to recognize the command (the "N" path from decision Block 11).

If the channel change instruction was not successful (the "N" path from decision Block 11), then the speed with which the system sent channel change commands exceeded the television receiver's capability to recognize the last command. The system accordingly reduces 12 the speed (OPTI-SPEED) that will be recorded as the final optimum speed to the last speed at which a channel change command was recognized by the system and saves the final optimum speed in Memory 3.

In one embodiment, the system sends a final sequence of channel change commands at the final optimum speed to test the conclusion before saving the optimum speed in memory. If the final test is successful, the system saves the final optimum speed in Memory 3. If the final test is not successful, the system again reduces the speed and performs another test. This reduction of speed process is continued until a sequential series of two channel change commands is recognized.

The final optimum speed is saved 13 in Memory 3 for every future use of the channel changing device. At that point, the initial learning setup procedure is complete (Stop Block 15).

In one embodiment, where there are multiple channel change devices coupled to the television receiver, the initial learning setup procedure is repeated to learn the optimum channel change speed for each device.

In one embodiment, after reducing the speed increment (14), the Microprocessor 21 is programmed to send a channel change command that resets the television receiver to a particular channel, for instance, the "INITIAL-CHANNEL." In one initializing channel embodiment, the Microprocessor 21 is programmed to follow the function block 14 with the steps, as depicted in FIG. 4, which would include: setting CHANNEL equal to INITIAL-CHANNEL (100); constructing a CHANNEL-CHANGE-INSTRUCTION for INITIAL-CHANNEL (101); setting NEXT-TIME equal to CLOCK-TIME plus INITIAL-SPEED (102); waiting until TIME greater than or equal to NEXT-TIME (103, 104, 106); when TIME is greater than or equal to NEXT-TIME (105), sending the CHANNEL-CHANGE-INSTRUCTION to the television receiver (107). Once the television receiver has been reset to the specified initialized channel, the Microprocessor 21 is programmed to continue with the next iteration of the speed optimization loop (function blocks 6 through 14).

C. Learning and Optimizing Channel Change Instruction Recognition Speed Factors for Exception Processing One embodiment of the invention incorporates special tests to learn certain exception processing characteristics of the channel changing device. One such special test is performed to determine the device's ability to detect a "bounce." A bounce condition exists when a viewer holds a single key for an extended period of time, thereby generating an echo, or "bounce" of the numbered digit. For example, when a viewer holds the "2" key on the remote control device for an extended period of time, the remote control device may generate and send a second "2" digit to the channel change device. Some channel change devices are not able to distinguish the bounce from the situation where the viewer actually presses the same key twice. The invention first tests to determine whether the channel change device has difficulty distinguishing, or cannot distinguish, a "bounce." In the case where the channel change device has difficulty distinguishing, or cannot distinguish, a "bounce," then the invention provides for a longer inter-digit timing period between two occurrences of the same digit.

Exception processing is also used to test a particular channel change device's capability to distinguish a request for a two digit channel change instruction as opposed to a three digit channel change instruction. For instance, a particular channel change device may have difficulty recognizing a channel change instruction to change to channel "12." The device may be configured to wait an extended period of time to ensure that a third digit does not follow, e.g., 125. In the case where a particular channel change device has difficulty recognizing a request for a two digit channel change instruction as opposed to a three digit channel change instruction, the invention provides for a longer inter-channel timing factor.

D. Channel Change Instructions Using Optimal Settings

After the system has learned the optimal settings for pulse width, inter-digit timing, and/or inter-channel change instruction time, the Microprocessor 21 uses the optimal settings to construct and deliver subsequent channel change commands.

E. Order of Steps Illustrative and Not a Limitation of Invention

It should be understood that the order of functions described herein are illustrative and/or exemplary and are not a limitation of the invention. Various and numerous other orders of the functions described herein may be devised by one skilled in the art without departing from the spirit and scope of this invention. For instance, in one embodiment, the functions described above for FIG. 3a in function blocks 33 and 34 can be performed separately. That is, a first pass is made to optimize the value for OPTI-WIDTH; a second pass is made to optimize the value for OPTI-TIME. As another example, the embodiments described herein have been described according to a process organization that performs subroutines which themselves perform subroutines. This organization is exemplary and is not in any way a limitation of the invention.

Illustrative Embodiments

The embodiments of the invention described herein are only considered to be preferred and/or illustrative of the inventive concept; the scope of the invention is not to be restricted to such embodiments. Various and numerous other arrangements may be devised by one skilled in the art without departing from the spirit and scope of this invention. For example, in one embodiment, the invention optimizes all three of the channel change speed factors—pulse width, inter-digit timing, and inter-channel change instruction time.

What is claimed is:

1. A system for determining an improved channel change command recognition speed for an entertainment system comprising:
    means for detecting a first speed at which a television tuner successfully executes channel change commands faster than a second speed;
    means for storing said first speed; and
    means for using said stored first speed to construct and send subsequent channel change commands to said television tuner.

2. The system for determining an improved channel change command recognition speed of claim 1 further comprising:
    means for a user to instruct said system to determine said improved speed by selecting the channel change speed improvement process from a menu of initialization processes.

3. The system for determining an improved channel change command recognition speed of claim 1 further comprising:
    means for repeating the steps of detecting, storing and using said improved speed for each channel change device in said entertainment system.

4. The system for determining an improved channel change command recognition speed of claim 2 further comprising:
    means for said user to identify the components in said system using a menu of options.

5. The system for determining an improved channel change command recognition speed of claim 2 wherein said user selects values for:
    initial channel-digit pulse width;
    initial inter-digit time; and
    the time increment used to decrement said channel-digit pulse width and said inter-digit time.

6. The system for determining an improved channel change command recognition speed of claim 5 wherein said values selected by said user are stored in memory.

7. The system for determining an improved channel change command recognition speed of claim 2 wherein initial channel-digit pulse width, initial inter-digit time and the time increment used to decrement said channel-digit pulse width and inter-digit time are preset by the manufacturer of said television tuner or channel change device.

8. The sytem for determining an improved channel change command recognition speed of claim 1 wherein improved speed comprises smaller time increments between discrete channel change commands.

9. The system for determining an improved channel change command recognition speed of claim 1 wherein improved speed comprises one or more of:
    shorter pulse width of each individual digit of a channel change command; and
    smaller time increments between digit pulse signals of a channel change command.

10. The system for determining an improved channel change command recognition speed of claim 1 wherein means for detecting said first speed further comprises:
   means for constructing channel change commands;
   means for sending successive channel change commands to said television tuner at progressively increasing speeds; and
   means for monitoring said televison tuner to detect faster speeds at which said television tuner successfully executes channel change commands.

11. The system for determining an improved channel change command recognition speed of claim 10 wherein said means for constructing channel change commands comprises a microprocessor.

12. The system for determining an improved channel change command recoginition speed of claim 10 wherein sending successive channel change commands at progressively increasing speeds further comprises:
   means for incrementing the speed at which the previous command was sent by a specific increment of time; and
   means for sending the subsequent command to said television tuner at said incremented speed.

13. The system for determining an improved channel change command recognition speed of claim 12 wherein said means for incrementing said speed further comprises means for alternately decrementing channel-digit pulse width and inter-digit time.

14. The system for determining an improved channel change command recognition speed of claim 10 further comprising:
   means for setting said television tuner to an initial channel before sending each channel change command.

15. The system for determining an improved channel change command recoginition speed of claim 10 wherein sending said successive commands further comprises:
   time means for providing an output as a function of time coupled to said means for sending successive commands; and
   said means for sending successive commands determining when to send said commands using said time means output.

16. The system for determining an improved channel command recognition speed of claim 10 further comprising:
   means for detecting the first channel change command said television tuner does not correctly execute;
   means for identifying the speed used to send said first command; and
   means for incrementally reducing speed by a specific increment of time until said television tuner correctly executes said channel change commands.

17. The system for determining an improved channel change command recognition speed of claim 16 wherein incrementally reducing said speed further comprises alternately increasing channel-digit pulse width and inter-digit time by said specific increment of time.

18. The system for determining an improved channel change command recognition speed of claim 10 further comprising:
   means for detecting the first channel change command said television tuner does not correctly execute;
   means for identifying the speed used to send said first command; and
   means for reducing said speed of said first command according to the time increment used to increase the speed of the previous command.

19. The system for determining an improved channel change command recognition speed of claim 10 further comprising:
   means for sending a sequence of two or more channel change commands at said faster speed; and
   means for detecting whether said channel change commands were successfully executed.

20. The system for determining an improved channel change command recognition speed of claim 19 further comprising:
   means for storing said faster speed if said channel change commands were successfully executed; and
   means for returning to the process of improving the speed at which said television tuner successfully executes channel change commands if said channel change commands were not successfully executed.

21. A method of determining an improved channel change command recognition speed for an entertainment system comprising:
   detecting a first speed at which a television tuner successfully executes channel change commands faster than a second speed;
   storing said first speed; and
   using said stored first speed to construct and send subsequent channel change commands to said television tuner.

22. The method of determining an improved channel change command recognition speed of claim 21 further comprising:
   a user instructing said system to determine said improved speed by selecting the channel change speed improvement process from a menu of initialization processes.

23. The method of determining an improved channel change command recognition speed of claim 21 further comprising:
   repeating the steps of detecting, storing and using said improved speed for each channel change device in said entertainment system.

24. The method of determining an improved channel change command recognition speed of claim 22 further comprising:
   user identifying the components in said system using a menu of options.

25. The method of determining an improved channel change command recognition speed of claim 22 further comprising said user selecting values for:
   initial channel-digit pulse width;
   initial inter-digit time; and
   the time increment used to decrement said channel-digit pulse width and said inter-digit time.

26. The method of determining an improved channel change command recognition speed of claim 25 further comprising:
   storing the values selected by said user in memory.

27. The method of determining an improved channel change command recognition speed of claim 22 wherein the manufacturer of said television tuner or channel change device presets initial channel-digit pulse width, initial inter-digit time and the time increment used to decrement said channel-digit pulse width and inter-digit time.

28. The method of determining an improved channel change command recognition speed of claim 21 wherein detecting said first speed further comprises:
   constructing channel change commands;

sending successive channel change commands to said television tuner at progressively increasing speeds; and monitoring said television tuner to detect faster speeds at which said television tuner successfully executes channel change commands.

29. The method of determining an improved channel change command recognition speed of claim 28, wherein sending successive channel change commands at progressively increasing speeds further comprises:

incrementing the speed at which the previous command was sent by a specific increment of time; and sending the subsequent command to said television tuner at said incremented speed.

30. The method of determining an improved channel change commnd recognition speed of claim 29 wherein incrementing said speed used to transmit commands further comprises alternately decrementing channel-digit pulse width and inter-digit time.

31. The method of determining an improved channel change command recognition speed of claim 28 further comprising:

setting said television tuner to an initial channel before sending each channel change command.

32. The method of determining an improved channel change command recognition speed of claim 28 wherein sending said successive commands further comprises:

determining when to send said successive commands as a function of time.

33. The method of determining an improved channel change command recognition speed of claim 28 further comprising:

detecting the first channel change command said television tuner does not correctly execute;

identifying the speed used to send said first command; and incrementally reducing said speed by a specific increment of time until said television tuner correctly executes said channel change commands.

34. The method of determining an improved channel change command recognition speed of claim 33 wherein incrementally reducing said speed further comprises alternately increasing channel-digit pulse width and inter-digit time by said specific increment of time.

35. The method of determining an improved channel change command recognition speed of claim 28 further comprising:

detecting the first channel change command said televion tuner does not correctly execute;

identifying the speed used to send said first command; and reducing said speed of said first command according to the time increment used to increase the speed of the previous command.

36. The method of determining an improved channel change command recognition speed of claim 21 further comprising:

sending a sequence of two or more channel change commands at said faster speed; and detecting whether said channel change commands were successfully executed.

37. The method of determining an improved channel change command recognition speed of claim 36 further comprising:

storing said faster speed if said channel change commands were successfully executed; and returning to the process of improving the speed at which said television tuner successfully executes channel change commands if said channel change commands were not successfuly executed.

38. A system for determining an improved channel change command recognition speed for an entertainment system comprising:

television tuner that receives channel change commands;

channel change detector;

microprocessor coupled to the transmitter that detects a first speed at which said television tuner successfully executes channel change commands faster than a second speed; and memory that stores said first speed, wherein said microprocessor is configured to construct and send subsequent channel change commands with the transmitter to said television tuner at said stored first speed.

39. The system for determining an improved channel change command recognition speed of claim 38 wherein:

said detecting, storing and sending using said first speed is repeated for each channel change device in said system.

40. The system for determining an improved channel change command recognition speed of claim 38 further comprising:

a display; and an input that receives user selections, wherein said microprocessor is configured to cause a menu of system initialization processes, including the channel change speed improvement process, to be displayed on said display.

41. The system for determining an improved channel change command recognition speed of claim 40 wherein said microprocessor is configured to cause a menu of system component identification options to be displayed on said display.

42. The system for determining an improved channel change command recognition speed of claim 40 wherein:

said microprocessor is configured to cause a menu of initialization value options to be displayed on said display; and said input receives user selected values for initial channel-digit pulse width, initial inter-digit time and the time increment used to decrement said channel-digit pulse width and said inter-digit time.

43. The system for determining an improved channel change command recognition speed of claim 42 wherein said memory stores said user selected values.

44. The system for determining an improved channel change command recognition speed of claim 40 wherein said memory stores preset values, inputted by the television tuner or channel change device manufacturer, for initial channel-digit pulse width, initial inter-digit time and the time increment used to decrement said channel-digit pulse width and inter-digit time.

45. The system for determining an improved channel change command recognition speed of claim 38 wherein:

said microprocessor constructs and sends successive channel change commands to said television tuner with said transmitter; and said microprocessor monitors said channel change detector to detect faster speeds at which said television tuner successfully executes channel change commands.

46. The system for determining an improved channel change command recognition speed of claim 45 wherein:

said successive channel change commands are sent at incrementally increased speeds relative to previous of said successive channel change commands.

47. The system for determining an improved channel change command recognition speed of claim 46 wherein speed is incrementally increased by alternately decrementing channel-digit pulse width and inter-digit time.

48. The system for determining an improved channel change command recognition speed of claim 45 wherein:
said television tuner is tuned to an initial channel before each of said commands is sent.

49. The system for determining an improved channel change command recognition speed of claim 45 wherein sending said successive commands further comprises:
a clock that provides output as a function of time coupled to said microprocessor.

50. The system for determining an improved channel change command recognition speed of claim 45 wherein:
said channel change detector detects the first channel change command said television tuner does not correctly execute; and
said microprocessor incrementally reduces the speed used to send said first command by a specific increment of time until said television tuner correctly executes said channel change commands.

51. The system for determining an improved channel change command recognition speed of claim 50 wherein said speed is incrementally reduced by alternately increasing channel-digit pulse width and inter-digit time.

52. The system for determining an improved channel change command recognition speed of claim 45 wherein:
said channel change detector detects the first channel change command said television tuner does not correctly execute; and
said microprocessor reduces the speed used to send said first command according to the time increment used to increase the speed of the previous command.

53. The system for determining an improved channel change command recognition speed of claim 45 wherein:
said microprocessor sends a sequence of two or more channel change commands at said faster speed with said transmitter; and
said channel change detector detects whether said channel change commands were successfully executed.

54. The system for determining an improved channel change command recognition speed of claim 53 wherein:
said memory stores said faster speed if said channel change commands were successfully executed; and
said microprocessor returns to the process of improving the speed at which said television tuner successfully executes channel change commands if said channel change commands were not successfully executed.

55. The system for determining an improved channel change command recognition speed of claim 38 wherein said transmitter comprises a cable box, a satellite receiver or a video cassette recorder.

56. The system for determining an improved channel change command recognition speed of claim 38 wherein:
said microprocessor is a dedicated microprocessor programmed to improve channel change command recognition speed; and
said microprocessor is coupled to a television microprocessor.

* * * * *